United States Patent
Moelle et al.

(10) Patent No.: US 7,713,638 B2
(45) Date of Patent: *May 11, 2010

(54) LAYER SYSTEM

(75) Inventors: Christoph Moelle, Bad Gandersheim (DE); Lars Bewig, Bad Gandersheim (DE); Frank Koppe, Bad Gandersheim (DE); Thomas Kuepper, Bad Gandersheim (DE); Stefan Geisler, Sarstedt (DE); Stefan Bauer, Alzey (DE); Juergen Dzick, Seelze (DE); Christian Henn, Bad-Krouznach (DE)

(73) Assignee: Schott AG, Mainz (DE)

(*) Notice: Subject to any disclaimer, the term of this patent is extended or adjusted under 35 U.S.C. 154(b) by 937 days.

This patent is subject to a terminal disclaimer.

(21) Appl. No.: 10/527,494

(22) PCT Filed: Sep. 13, 2003

(86) PCT No.: PCT/EP03/10219

§ 371 (c)(1),
(2), (4) Date: Oct. 11, 2005

(87) PCT Pub. No.: WO2004/026782

PCT Pub. Date: Apr. 1, 2004

(65) Prior Publication Data

US 2006/0246321 A1  Nov. 2, 2006

(30) Foreign Application Priority Data

Sep. 14, 2002 (DE) .................... 102 42 848

(51) Int. Cl.
*B32B 9/00* (2006.01)

(52) U.S. Cl. ............. 428/701; 428/689; 428/699; 428/702

(58) Field of Classification Search .......... None
See application file for complete search history.

(56) References Cited

U.S. PATENT DOCUMENTS

| 5,914,817 | A | * | 6/1999 | Browning et al. | ........... 359/634 |
| 7,018,727 | B2 | * | 3/2006 | Dzick | ........................ 428/699 |
| 7,381,469 | B2 | * | 6/2008 | Moelle et al. | ............... 428/432 |

FOREIGN PATENT DOCUMENTS

| EP | 0 465 309 A1 | 1/1992 |
| EP | 0 479 678 A1 | 4/1992 |
| JP | 3135502 | 6/1991 |
| JP | 7138048 | 5/1995 |
| JP | 11149063 | 6/1999 |
| JP | 2002014203 | 1/2002 |
| WO | WO 85/05292 | 12/1985 |
| WO | WO 97/08357 | 3/1997 |

OTHER PUBLICATIONS

Article: Comparison of pure and mixed coating materials for AR coatings for use by reactive evaporation on glass and plastic lenses, Selhofer & Müller, Elsevier, Thin Solid Films 351 (1999) 180-183.
Notification and Reasons for Rejection dated Mar. 16, 2009 corresponding to Japanese Patent Application No. 2004-537080.

* cited by examiner

*Primary Examiner*—Ling Xu
(74) *Attorney, Agent, or Firm*—Ohlandt, Greeley, Ruggiero & Perle, L.L.P.

(57) ABSTRACT

The invention relates to layer systems having at least one layer comprising titanium aluminum oxide. The layer comprising titanium aluminum oxide may be either a functional layer—with or without interruption by an intermediate layer which is optically inactive—or a functional layer formed from a metal oxide which is interrupted by an intermediate layer comprising titanium aluminum oxide. The layer systems are structurally and thermally stable at operating temperatures of over 600° C. The layer systems may either comprise only one functional layer or may be a multilayer system, preferably an alternating layer system composed of functional layers with high and low refractive indices.

24 Claims, 3 Drawing Sheets

| Material | Layer thickness [nm] |
|---|---|
| SiO2 | 30.00 |
| Al:TiO2 | 113.94 |
| SiO2 | 29.78 |
| Al:TiO2 | 108.85 |
| SiO2 | 130.32 |
| Al:TiO2 | 94.38 |
| SiO2 | 102.40 |
| Al:TiO2 | 96.95 |
| SiO2 | 125.72 |
| Al:TiO2 | 96.46 |
| SiO2 | 129.53 |
| Al:TiO2 | 80.73 |
| SiO2 | 127.15 |
| Al:TiO2 | 89.51 |
| SiO2 | 118.31 |
| Al:TiO2 | 88.22 |
| SiO2 | 99.11 |
| Al:TiO2 | 60.17 |
| SiO2 | 52.51 |
| Al:TiO2 | 91.40 |
| SiO2 | 105.32 |
| Al:TiO2 | 64.94 |
| SiO2 | 119.08 |
| Al:TiO2 | 70.22 |
| SiO2 | 77.60 |
| Al:TiO2 | 58.46 |
| SiO2 | 97.38 |
| Al:TiO2 | 78.59 |
| SiO2 | 107.96 |
| Al:TiO2 | 57.55 |
| SiO2 | 61.97 |
| Al:TiO2 | 42.35 |
| SiO2 | 94.20 |
| Al:TiO2 | 52.25 |
| SiO2 | 68.78 |
| Al:TiO2 | 47.56 |
| SiO2 | 89.22 |
| Al:TiO2 | 54.35 |
| SiO2 | 64.90 |
| Al:TiO2 | 40.70 |
| SiO2 | 88.57 |
| Al:TiO2 | 46.89 |
| SiO2 | 77.06 |

Fig. 1   Reflector coating

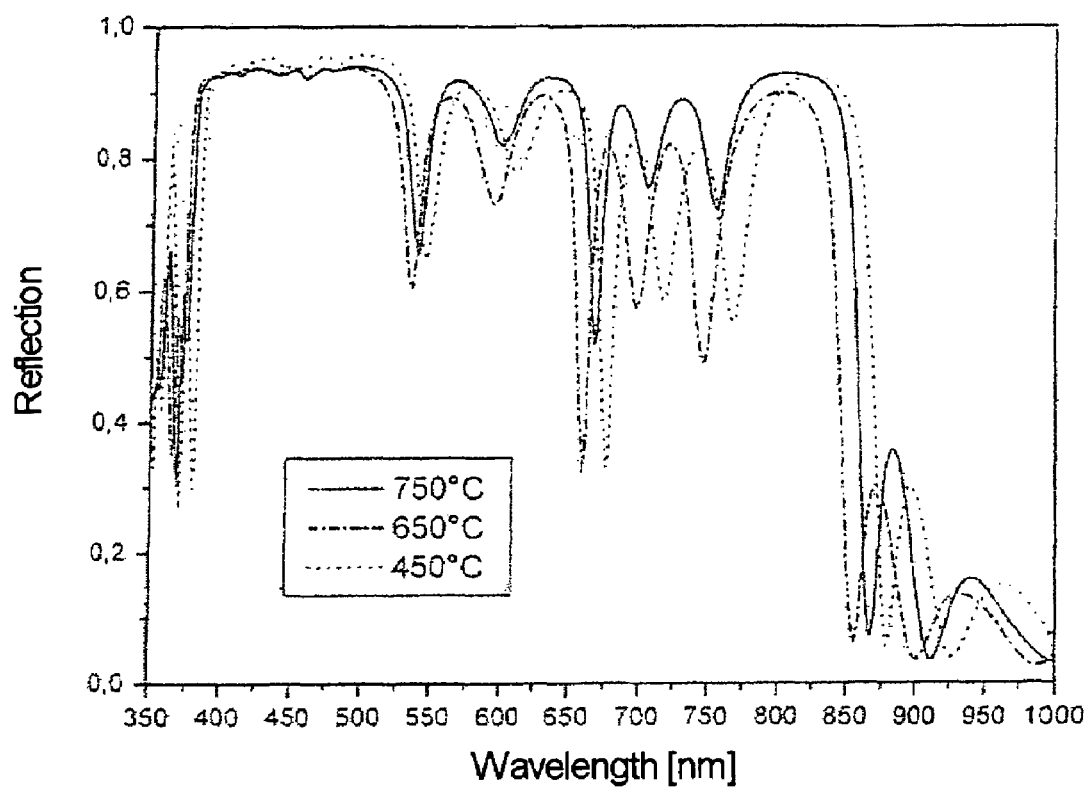
Fig. 2 Reflection properties of the reflector

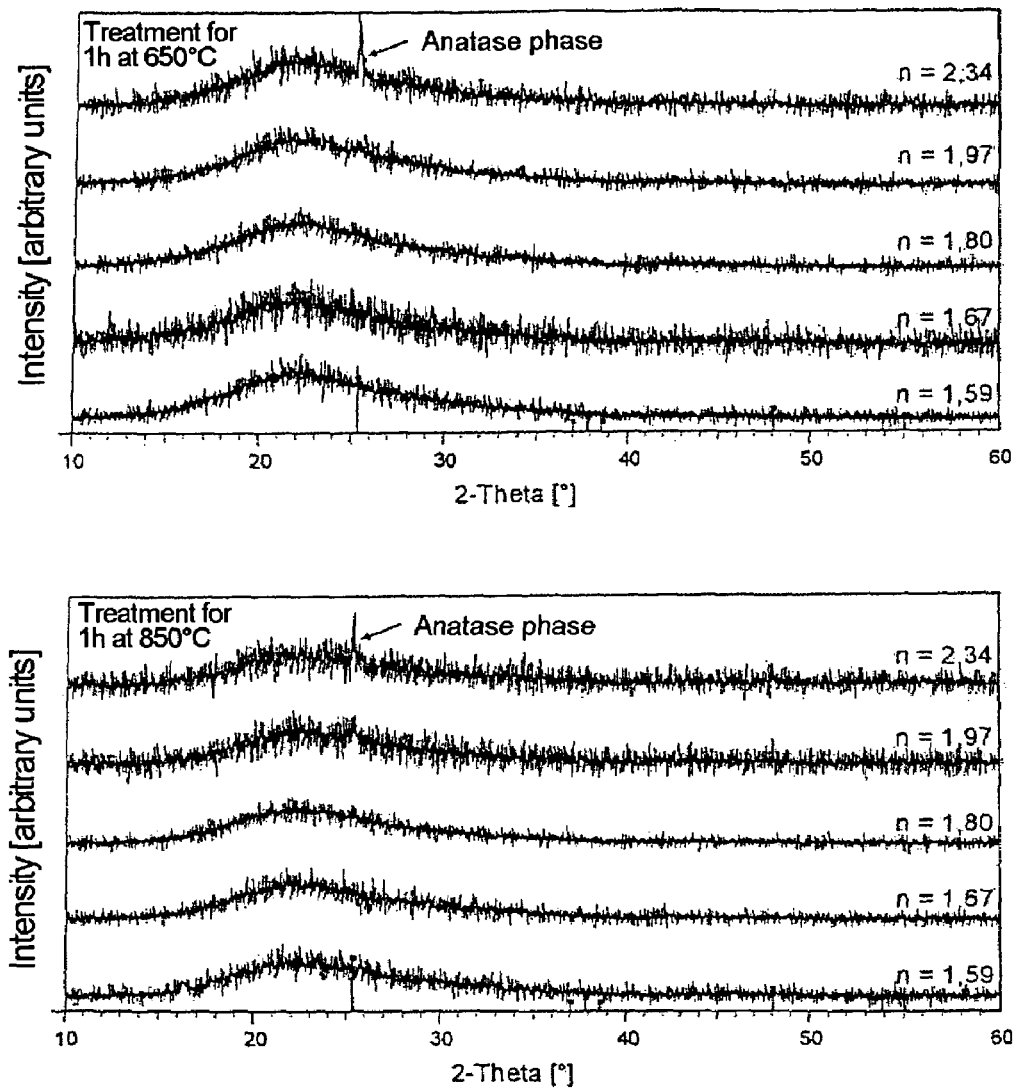
Fig. 3 Diffractograms of titanium aluminum oxide layers
| Ti [Atom%] | Al [Atom%] | Ti:Al | n |
|---|---|---|---|
| 3,76 | 0,98 | 3,84:1 | 2,34 |
| 2,83 | 3,98 | 1:1,41 | 1,97 |
| 2,24 | 6,5 | 1:2,9 | 1,8 |
| 1,85 | 8,95 | 1:4,84 | 1,67 |
| 0,57 | 13,13 | 1:23 | 1,587 |
Fig. 4 Overview of Fig. 3

LAYER SYSTEM

BACKGROUND OF THE INVENTION

1. Field of the Invention

The invention relates to a layer system having at least one metal oxide layer, the metal oxide comprising a titanium aluminum oxide. The layer system has a high structural and thermal stability, in particular at operating temperatures of over 600° C., and is especially suitable for optical coatings, without being restricted to this particular application.

2. Background of the Invention

Optical layer systems, in particular alternating layer systems, which are composed of alternating thin films with high and low refractive indices on top of one another, have been known for years for a wide range of applications. They act as a light interference film, the optical properties of which are determined by the choice of material for the layer with a high and/or low refractive index and therefore the choice of the corresponding refractive index, by the arrangement of the individual layers and by the choice of the individual layer thicknesses. The selection is substantially based on known optical design rules and design aids in accordance with the criteria of the desired optical properties and the processing properties.

Examples of suitable starting materials for the production of coatings of this type for, for example, reflectors, mirrors, filters, lamps, IRC torches/lamps, etc. include, inter alia, $TiO_2$ and $SiO_2$.

Thin films of these materials are usually applied by CVD processes (CVD=Chemical Vapor Deposition), PVD processes (PVD=Physical Vapor Deposition) or sol-gel processes and are distinguished by the fact that they are hard and chemically stable and have a high refractive index difference.

With regard to stability with respect to high temperatures, few problems are expected with silicon oxides. However, if titanium oxide is used as layer material with a high refractive index, problems arise at high operating temperatures (>600° C.), as may be reached, for example, for glass-ceramic reflectors or IRC lamps. The titanium oxide changes at these high temperatures. This is attributable in particular, as described extensively by H. Sankur and W. Gunning in J. Appl. Phys. 66 (1989), to the phase transformation of the $TiO_2$ applied in the amorphous state. At temperatures of over 350° C., $TiO_2$ crystallizes to form the anatase phase, then the rutile phase at temperatures around 600° C. This produces turbidity in the coating, and its optical properties, which have been optimized by means of a specific optical design, deteriorate.

DE 3227069 A1 discloses an optical coating which is suitable for high temperatures and comprises an alternating layer system made up of $SiO_2$ as layer material with a low refractive index and $Ta_2O_5$ as layer material with a high refractive index. This coating is able to withstand high temperatures and is aimed at improving the working efficiency of the coated object, in particular of halogen lamps.

An improvement to the working efficiency and a higher thermal stability compared to the use of $TiO_2$ as layer with a high refractive index can certainly be achieved, but using $Ta_2O_5$ in the high-temperature range also causes considerable turbidity in the layers, and consequently these coatings are unsuitable for many application areas.

BRIEF SUMMARY OF THE INVENTION

It is an object of the invention to provide a coating which is substantially structurally stable and remains (virtually) free of turbidity at high operating temperatures.

According to the invention, the object is achieved by a layer system as provided by the present invention.

The layer system according to the invention includes at least one layer formed from a metal oxide which comprises titanium aluminum oxide. The individual layers of the layer system which are required, for example, to produce a specific optical design of the layer system are referred to below as functional layers.

Functional layers formed from titanium aluminum oxide have a significantly higher thermal and structural stability than the known functional layers formed from metal oxides.

Since a functional layer comprising titanium aluminum oxide inherently ensures a high thermal stability, an additional interruption with an intermediate layer formed from a different metal oxide makes a contribution to achieving the object to the extent that they can be additionally stabilized, but primarily serves to further improve the mechanical and optical properties of functional layers comprising titanium aluminum oxide. To avoid optically undesirable influences from the intermediate layer, either the thickness or the refractive index of the intermediate layer is to be selected to be such that this layer is optically inactive. In addition to their high thermal stability, by way of example layers of this type also have a high brilliance, cause an improvement to desired optical characteristic values, such as for example reflectivity or transmissivity, and a high scratch resistance.

A further layer system according to the invention likewise comprises at least one functional layer formed from a metal oxide, wherein at least one intermediate layer comprising titanium aluminum oxide interrupts at least one functional layer formed from a metal oxide that is different than the intermediate layer. In this case, either the thickness or the refractive index of the intermediate layer is to be selected to be such that this layer is optically inactive.

By interrupting the morphology of functional layers formed from metal oxides by means of intermediate layers which comprise titanium aluminum oxide, it is likewise possible to achieve the desired thermal and structural stability of functional layers formed from metal oxides. Furthermore, the interruption with these intermediate layers allows the mechanical and optical properties of the functional layers formed from a metal oxide to be significantly improved. This opens up a wide range of application areas for layer systems according to the invention.

It is expedient for functional layers to be interrupted in such a manner as to form sublayers which do not undergo any changes to their structure under high thermal loads. For example, amorphous functional layers formed from metal oxides whose individual sublayers remain below a thickness of 50 nm are not subject to any crystallization under the action of high temperatures.

One particular effect of the invention is the possibility of setting the refractive index of the layer comprising titanium aluminum oxide by setting the quantitative ratio of aluminum to titanium. The refractive index n can be varied in a range from $1.55 = n = 2.50$. Increasing the aluminum content reduces the refractive index n of the layer. Even small quantities of aluminum (Al: Ti for example approx. 1:3.84; with n=2.34) significantly improve the structural stability and thermal stability of a functional layer. This makes these layers very flexible in use.

The ability to set the refractive index of the layer comprising titanium aluminum oxide can be utilized particularly advantageously to match the refractive index of the functional layer to that of the intermediate layer, or vice-versa. Therefore, functional layers formed from metal oxides with a refractive index n in the range from $1.55 = n = 2.50$ (for example from zirconium oxide or stabilized zirconium oxide which has been stabilized by the addition of a stabilizer material, such as for example yttrium oxide, etc, with n approx. 2.1) can be interrupted by an intermediate layer formed from titanium aluminum oxide without being optically influenced thereby. In this case, the intermediate layers no longer have to have the low thicknesses of intermediate layers with a differing refractive index, which have to remain below a thickness at which they can become optically active. A similar statement also applies to the interruption of titanium aluminum oxide functional layers by intermediate layers formed from a metal oxide.

The layer systems according to the invention may comprise either a single functional layer or a layer system having a plurality of functional layers, preferably an alternating layer system formed from functional layers with high and low refractive indices.

In this case, alternating layer systems made up of functional layers comprising titanium aluminum oxide as functional layers with a high refractive index and titanium aluminum oxide functional layers interrupted by intermediate layers or functional layers partially interrupted by titanium aluminum oxide intermediate layers and formed from metal oxides of high refractive index are equally possible.

In one preferred embodiment of the layer systems according to the invention as alternating layer system formed from functional layers with high and low refractive indices, the functional layer with a high refractive index comprises a titanium aluminum oxide. It preferably consists of $Ti_xAl_{1-x}O_y$, with $0<x<1$, preferably with $0.3<x<1$ particularly advantageously with $0.5<x<1$. The lower the level of aluminum, the higher the refractive index of the functional layer becomes. The functional layer of low refractive index then comprises a silicon oxide, preferably silicon dioxide. Silicon dioxide is likewise able to withstand high temperatures and has a low refractive index compared to the titanium aluminum oxide.

With regard to the optical design, a certain layer structure is predetermined in terms of the sequence and thickness of the functional layers. The corresponding optical layer thicknesses n*d are of the order of magnitude of ë/4 (n=refractive index of the layer; ë=design wavelength) or below. The values for the layer thicknesses $d_F$ of the functional layers for applications of the layer system according to the invention in the near IR and visible regions are then preferably 5 nm=$d_F$=200 nm. Layer systems of this type for optical applications are eminently suitable for use in high-temperature ranges, i.e. at operating temperatures of over 600° C.

If, moreover, the functional layers with a high refractive index are interrupted by intermediate layers with a low refractive index and vice-versa, it is important, in particular with optical layer systems, for the intermediate layers which interrupt the functional layers to remain below a thickness at which they could become optically active in the layer system as a whole. Suitable thicknesses $d_Z$ for the intermediate layers are then in the range from 0.3 nm=$d_Z$=10 nm, preferably in the range from 0.5 nm=$d_Z$=4.0 nm and particularly appropriately in the range from 1.0 nm=$d_Z$=2.5 nm. The use and number of the intermediate layers should preferably be selected in such a way that the thickness $d_T$ of the sublayers formed from the functional layer is approximately 20 nm=$d_T$=250 nm. Therefore, suitable layer thicknesses for functional layers to be interrupted are $d_T$=40 nm.

In this context, it is particularly important for the process engineering sequence if, in an alternating layer system formed from functional layers with a high refractive index and a low refractive index, the functional layers with a high refractive index are interrupted by intermediate layers formed from the layer material with a low refractive index. Furthermore, it is possible for the functional layers with a low refractive index to be interrupted by intermediate layers formed from the layer material with a high refractive index. In this case, it is not absolutely necessary to interrupt every functional layer.

However, it is not essential for the intermediate layer to have a different refractive index than the functional layer, but rather it must be suitable to influence the structure formation in the functional layer so that high temperatures do not cause any deterioration in the optical properties of the coating. It is therefore also possible for functional layers with a high refractive index formed, for example, from titanium oxide to be interrupted by intermediate layers with a high refractive index formed from titanium aluminum oxide. Chemical vapor deposition processes, preferably plasma-enhanced, in particular the PICVD process (PICVD=Plasma Impulse Chemical Vapor Deposition), are advantageously suitable for production of the layer systems according to the invention.

These processes allow uniform and accurate production of layers, making them eminently suitable for industrial coating processes. Furthermore, this process can be used to control the ratio of aluminum content to titanium content in a particularly simple way.

Sol-gel processes are likewise advantageously suitable for industrial production of the coating.

In principle, however, it is also possible for the layer system according to the invention to be produced using PVD processes (PVD=Physical Vapor Deposition), such as for example evaporation coating, sputtering or other processes.

A very wide range of substrate materials can be used depending mainly on the application area for the coated object. For use in the high-temperature range, the associated thermal load should be taken into account appropriately. Suitable substrate materials are both metals, glass and glass-ceramics as well as plastics.

According to the invention, the layer systems are used for the coating of reflectors, in particular for the coating of glass-ceramic reflectors. These coatings allow excellent optical and mechanical properties of the reflectors to be achieved even under long and extreme thermal loads on account of the structural and thermal stability of the coating.

Furthermore, according to the invention the layer systems are used for the coating of illumination bodies, in particular of IRC lamps/torches. In this case too, these coatings can produce excellent optical and mechanical properties of the illumination bodies under long and extreme thermal loads on account of the structural and thermal stability of the coating.

BRIEF DESCRIPTION OF THE SEVERAL VIEWS OF THE DRAWINGS

The invention is to be explained in more detail below on the basis of the exemplary embodiments and figures, in which:

FIG. 1 shows a layer system according to the invention for a reflector coating

FIG. 2 shows the reflection properties of the reflector at temperatures of 450° C., 650° C. and 750° C.

FIG. 3 shows the diffractograms of titanium aluminum oxide layers with different refractive indices after treatments at 650° C. and 850° C.

FIG. 4 shows a table summary of the quantitative ratios of Al:Ti for the diffractograms of titanium aluminum oxide layers illustrated in FIG. 3.

DETAILED DESCRIPTION OF THE INVENTION

FIG. 1 shows an optical layer system according to the invention for a reflector. The reflector has a high reflection in the wavelength region for visible light and is therefore eminently suitable for illumination purposes. By virtue of its high transmission in the near IR and a resulting low heat reflection, it is particularly suitable for temperature-intensive illuminations and can be used, for example, in digital projectors.

The layer system is an alternating layer system and comprises 43 functional layers. The functional layer with a low refractive index is formed from $SiO_2$ and the functional layer with a high refractive index is formed from $Ti_xAl_{1-x}O_y$.

The quantitative ratio of aluminum to titanium is Al:Ti=1: 2.09. At this quantitative ratio, the $Ti_xAl_{1-x}O_y$ layer has a refractive index n=2.26. The precise arrangement and the individual layer thicknesses are shown in the table presented in FIG. 1. In the embodiment illustrated in FIG. 1, the y is equal to 2.

The individual functional layers were produced by means of PICVD processes. With this process, the person skilled in the art is able to control the aluminum content in the usual way, so that it was possible to set the refractive index of the titanium aluminum oxide layer in a targeted fashion.

Reflectors produced in this manner were then exposed to thermal loads of 450° C., 650° C. and 750° C. The reflectors did not reveal any turbidity following these thermal loads.

FIG. 2 shows the reflection characteristics of the reflectors under the different thermal loads mentioned above. When testing the reflection properties of the reflector coating according to the invention, it was likewise possible to demonstrate that the high operating temperatures have scarcely any significant effect on the reflection properties, and in particular the reflection properties of the reflectors remain stable in the desired wavelength range from 370 nm<ë<800 nm. At the same time, the high transmission of the reflectors in the near IR is retained.

The reflector which is described by way of example and has a structurally and thermally stable coating according to the invention can be used in digital projectors but is also suitable for illumination purposes in high-voltage and low-voltage technology, for example for use in halogen illumination technology.

Furthermore, the properties of an individual layer according to the invention were investigated.

For this purpose, substrates made from quartz glass were coated with in each case one $Ti_xAl_{1-x}O_y$ individual layer (0<x<1) with a layer thickness of 500 nm by means of a PICVD process. Different quantitative proportions of aluminum and titanium were set in the coating process in order to vary the refractive index between the minimum and maximum possible values of 1.55=n=2.50. The ratios set in the layers were measured by means of EDX. The corresponding quantitative ratio can be determined from the measured proportions in at %. The individual values for the quantitative proportions in at % of titanium and aluminum, the associated quantitative ratio of Ti:Al and the corresponding refractive indices are given in the summary presented in FIG. 4.

Increase in the aluminum content reduces the refractive index n of the layer.

Then, the coated substrates were exposed to a thermal load of 650° C. or 850° C. for one hour. The X-ray examinations of the individual specimens illustrated in FIG. 3 following the treatment at 650° C. and 850° C. show that only in each case the layer with the lowest aluminum content, with n=2.34, reveals any incipient formation of the anatase phase. However, even small quantities of aluminum are sufficient to prevent the formation of crystals under high-temperature loads. Compared to pure titanium dioxide, both the crystallization of an amorphous layer to form anatase at low temperatures and the recrystallization to form the rutile phase at temperatures above 600° C. are suppressed. None of the layers examined had any turbidity phenomena.

Therefore, substrates which have been coated with an individual functional layer according to the invention can also be used for a very wide range of applications, preferably in the high-temperature range, since they remain structurally stable without any turbidity even under extreme thermal loads of more than 600° C.

The use of a layer system according to the invention on IRC lamps/torches represents a further possible application example. The layer system in this case comprises an alternating layer system formed from functional layers with a high refractive index and a low refractive index. These interference layer systems typically comprise more than 30 functional layers.

The designs of alternating layer systems for lamps or torches of this type are well known. They are such that the light generated by the lamp in the visible wavelength region is transmitted and the IR radiation which is generated simultaneously is reflected into the light-generating body (IRC system=Infrared-reflective coating).

The reflected radiation makes a significant contribution to reaching the operating temperature of the luminous body. The temperature of the lamp bulb or torch may under certain circumstances amount to more than 1000° C.

Hitherto, known alternating layer systems were only able to withstand thermal loads of up to approximately 600° C., which was attributable in particular to the inadequate thermal stability of the layer with a high refractive index.

The use of suitable functional layers with a high refractive index formed from aluminum titanium oxide and/or of metal oxide functional layers with intermediate layers interrupting them in the coating makes it possible to increase the thermal stability of the IRC lamps/torches to well over 600° C.

The invention claimed is:

1. A layer system, comprising:
   at least one functional layer formed from titanium aluminum oxide, wherein the at least one functional layer is interrupted by at least one intermediate layer formed from a different metal oxide than the at least one functional layer and wherein the at least one intermediate layer has a thickness from 0.3 nm to 4.0 nm.

2. The layer system as claimed in claim 1, wherein the at least one intermediate layer comprises silicon oxide.

3. The layer system as claimed in claim 1, wherein the at least one intermediate layer has a refractive index equal to a refractive index of the at least one functional layer.

4. The layer system as claimed in claim 3, wherein the at least one intermediate layer comprises zirconium oxide.

5. The layer system as claimed in claim 1, wherein the at least one functional layer has a refractive index that can be set in a range of 1.55 to 2.50 by a quantitative ratio of titanium to aluminum.

6. The layer system as claimed in claim 1, wherein the at least one functional layer comprises a plurality of functional layers.

7. The layer system as claimed in claim 1, wherein the at least one functional layer is produced by chemical vapor deposition processes.

8. The layer system as claimed in claim 1, wherein the at least one functional layer is produced by physical vapor deposition processes.

9. The layer system as claimed in claims 1, wherein the at least one functional layers is produced by sol-gel processes.

10. The layer system as claimed in claim 1, wherein the layer system is usable as a coating for an illumination body.

11. The layer system as claimed in claim 10, wherein the ilumination body is an IRC lamp or an IRC torch.

12. The layer system as claimed in claim 1, wherein the layer system is usable as a coating for a reflector.

13. The layer system as claimed in claim 12, wherein the reflector is a glass-ceramic reflector.

14. The layer system as claimed in claim 1, wherein the layer system comprises an alternating layer system comprising a plurality of functional layers of high refractive index and a plurality of functional layers of low refractive index.

15. The layer system as claimed in claim 14, wherein the plurality of functional layers of high refractive index comprise titanium aluminum oxide.

16. The layer system as claimed in claim 15, wherein the plurality of functional layers of low refractive index comprise silicon oxide.

17. The layer system as claimed in claim 16, wherein the plurality of functional layers of high refractive index are interrupted by a plurality of intermediate layers of low refractive index comprising silicon oxide.

18. The layer system as claimed in claim 16, wherein the plurality of functional layers of low refractive index are interrupted by a plurality of intermediate layers of high refractive index comprising titanium aluminum oxide.

19. The layer system as claimed in claim 1, wherein the at least one intermediate layer has a thickness from 0.3 nm to 4.0 nm.

20. A layer system, comprising:
   at least one intermediate layer comprising titanium aluminum oxide, the at least one intermediate layer interrupting at least one functional layer formed from a different metal oxide than the at least one intermediate layer, wherein the at least one intermediate layer has a thickness from 0.3 nm to 4.0 nm.

21. The layer system as claimed in claim 20 wherein the at least one functional layer comprises silicon oxide.

22. The layer system as claimed in claim 20 wherein the at least one functional layer has a refractive index equal to a refractive index of the at least one intermediate layer.

23. The layer system as claimed in claim 22, wherein the at least one functional layer comprises zirconium oxide.

24. The layer system as claimed in claim 20, wherein the at least one intermediate layer has a thickness from 0.3 nm to 4.0 nm.

* * * * *